United States Patent
Naito

(10) Patent No.: US 8,259,766 B2
(45) Date of Patent: Sep. 4, 2012

(54) LASER DIODE DRIVE CIRCUIT, ELECTRONIC CIRCUIT, METHOD FOR CONTROLLING LASER DIODE DRIVE CIRCUIT, AND METHOD FOR CONTROLLING DUTY

(75) Inventor: Hidetoshi Naito, Yamanashi (JP)

(73) Assignee: Eudyna Devices Inc., Yamanashi (JP)

( * ) Notice: Subject to any disclaimer, the term of this patent is extended or adjusted under 35 U.S.C. 154(b) by 133 days.

(21) Appl. No.: 12/241,927

(22) Filed: Sep. 30, 2008

(65) Prior Publication Data

US 2009/0028200 A1  Jan. 29, 2009

Related U.S. Application Data

(63) Continuation of application No. PCT/JP2007/056427, filed on Mar. 27, 2007.

(30) Foreign Application Priority Data

Mar. 31, 2006 (JP) ................................. 2006-097498

(51) Int. Cl.
 *H01S 3/00* (2006.01)
(52) U.S. Cl. ................................. 372/38.02; 372/38.07
(58) Field of Classification Search ............... 373/38.02; 372/38.02
 See application file for complete search history.

(56) References Cited

U.S. PATENT DOCUMENTS 5,270,736 A  12/1993  Inoue et al.
6,795,656 B1 *  9/2004  Ikeuchi et al. ................ 398/197
7,166,826 B1 *  1/2007  Kunst et al. .................... 250/205
2005/0129075 A1 *  6/2005  Anderson et al. .......... 372/38.02

FOREIGN PATENT DOCUMENTS

| JP | 3-105368 A | | 5/1991 |
|---|---|---|---|
| JP | 4-155981 A | | 5/1992 |
| JP | 05-129689 | * | 5/1993 |
| JP | 5-129689 A | | 5/1993 |
| JP | 7-240557 A | | 9/1995 |
| JP | 8-279788 A | | 10/1996 |
| JP | 9-200153 A | | 7/1997 |
| JP | 9-246646 A | | 9/1997 |

(Continued)

OTHER PUBLICATIONS

International Search Report of PCT/JP2007/056427, date of mailing Apr. 24, 2007.

(Continued)

*Primary Examiner* — Patrick Stafford
*Assistant Examiner* — Xinning Niu
(74) *Attorney, Agent, or Firm* — Westerman, Hattori, Daniels & Adrian, LLP

(57) ABSTRACT

A laser diode drive circuit includes: a duty control amplifier (23) that controls the duty ratio of a main signal for laser control in accordance with a duty control signal; and an AND gate (22) that outputs the duty control signal to the duty control amplifier (23), and outputs a duty control signal that controls the duty ratio of the main signal to be 0% in the duty control amplifier in accordance with a shutdown signal of a laser diode. With this structure, there is no need to input the main signal having the duty ratio controlled to a logic circuit that becomes unstable. Thus, outputs from a semiconductor laser can be shut down, and the output duty can be controlled in a stable manner.

9 Claims, 6 Drawing Sheets

FOREIGN PATENT DOCUMENTS

| | | | |
|---|---|---|---|
| JP | 11-177174 | * | 2/1999 |
| JP | 11-121844 | A | 4/1999 |
| JP | 11-177174 | A | 7/1999 |
| JP | 2001-244556 | A | 9/2001 |
| JP | 2001-320122 | A | 11/2001 |
| JP | 2003-298524 | A | 10/2003 |
| WO | 98/56089 | A1 | 12/1998 |

OTHER PUBLICATIONS

Japanese Office Action dated Aug. 2, 2011, issued in corresponding Japanese Patent Application No. 2006-097498.

* cited by examiner

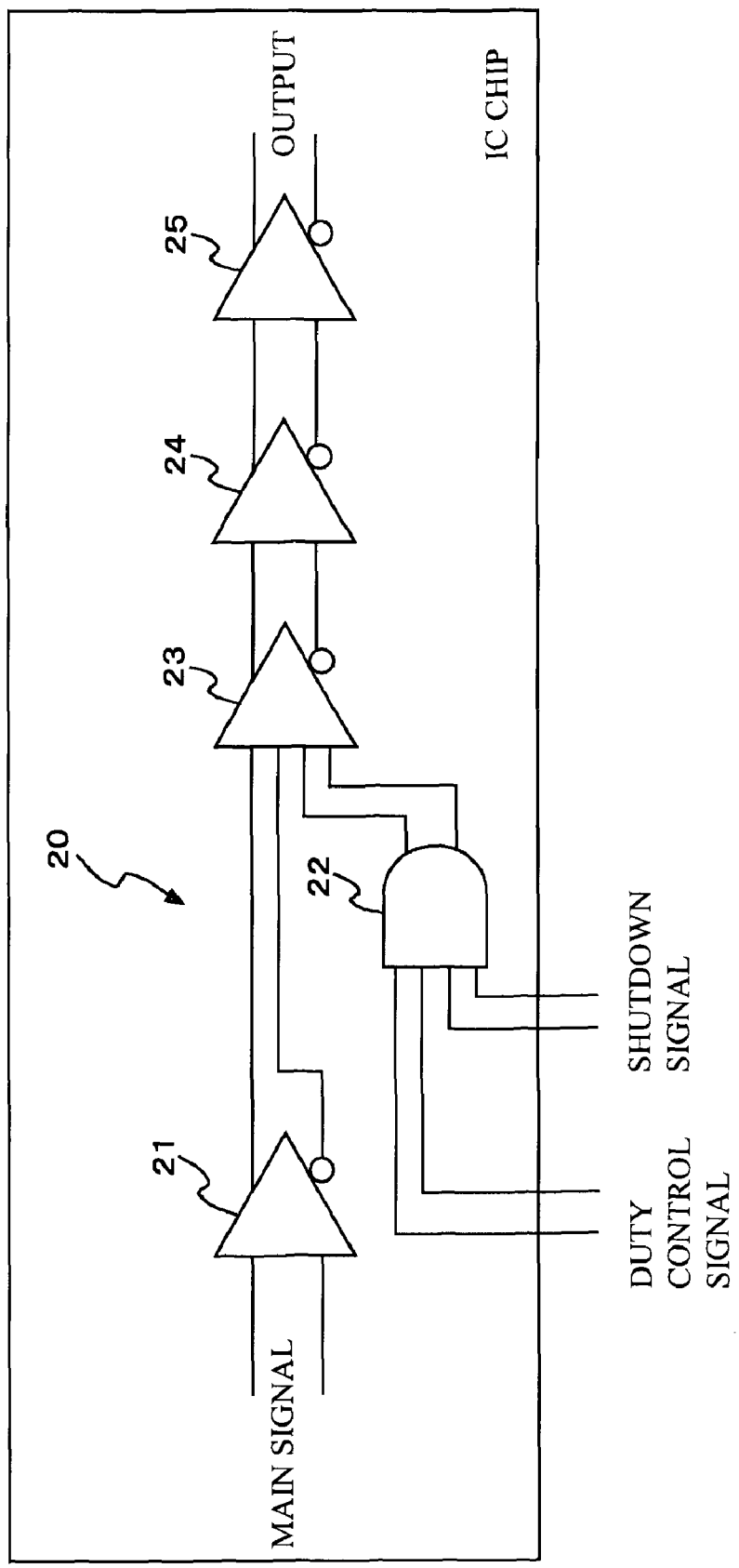

LASER DIODE DRIVE CIRCUIT, ELECTRONIC CIRCUIT, METHOD FOR CONTROLLING LASER DIODE DRIVE CIRCUIT, AND METHOD FOR CONTROLLING DUTY

FIELD OF THE INVENTION

The present invention relates to a laser diode drive circuit (hereinafter referred to simply as a LD drive circuit). More particularly, the present invention relates to a LD drive circuit for direct modulation that performs modulation by directly switching on and off the current for controlling light emission from a semiconductor laser.

BACKGROUND OF THE INVENTION

Semiconductor lasers are used in various fields, and intensive studies are being made to develop drive circuits for driving the semiconductor lasers (see Japanese Unexamined Patent Publication No. 2001-244556, for example). FIG. 1 illustrates a typical example structure of a LD drive circuit for direct modulation that performs modulation by switching on and off the current for controlling the light emission from a semiconductor laser. The LD drive circuit for direct modulation includes differential amplifiers arranged in stages, as shown in FIG. 1, and has a duty variable function and an output shutdown function for shutting down outputs from a laser diode.

A first amplifier 2 shown in FIG. 1 is a duty control amplifier, and a second amplifier 3 functions as a buffer amplifier. Amplifiers 5 and 6 in the stages after an AND gate 4 function as amplifiers for amplification.

FIG. 2 illustrates the circuit structure of the AND gate 4. The AND gate 4 includes: a differential FET pair 7 and 8 that capture a main signal for switching on and off a semiconductor laser; a differential FET pair 10 and 11 for data clamping; and a FET 12 that is placed below the shared source of the differential FET pair 10 and 11, and functions as a current source. The differential FET pair 10 and 11 function as a clamping circuit 9.

The first amplifier 2 superimposes a duty control signal that controls the duty ratio of the main signal to the main signal for controlling the switching on and off of the semiconductor laser. To change the duty ratio of the main signal, the output signal of the first amplifier 2 has the waveforms shown in FIG. 3B. FIG. 3A shows the main signal to be input to the first amplifier 2. FIG. 3B shows the output signal of the first amplifier 2. As shown in FIG. 3B, the main signal after the duty ratio control is an unstable signal that has different voltage levels between the normal side and the inverted side.

In recent years, +3.3V power sources are widely used as operation power sources, and the margin between signals is becoming smaller as the voltage to be applied is becoming lower. Under such circumstances, when signals having different voltage levels are input directly to the AND gate 4 shown in FIG. 2, the AND gate 4 might malfunction and fail to operate properly, and the outputs of the clamping circuit 9 might not be maintained at uniform levels.

To counter this problem, the second amplifier 3 as a buffer is interposed between the first amplifier 2 and the AND gate 4 in the conventional LD drive circuit. With this arrangement, a main signal is input to the AND gate 4, after the level of the main signal having an adjusted duty ratio is adjusted.

As described above, the conventional LD drive circuit needs to have a buffer amplifier for signal level adjustment (the second amplifier 3), and has the problem of larger power consumption.

In a case where the duty ratio of a main signal is adjusted by superimposing the main signal with a duty control signal, the duty variable characteristics are varied with the amplitude of the main signal. For example, if the amplitude of the main signal is large, the variation in the duty ratio of the main signal is small, even after the duty ratio is adjusted by superimposing the main signal with a duty control signal. If the amplitude of the main signal is small, the duty ratio of the main signal is greatly varied after the duty ratio is adjusted by superimposing the main signal with a duty control signal.

In a case where the number of amplifier stages is reduced by giving a gain to the buffer amplifier for signal level adjustment (or the buffer amplifier also serves as a driver amplifier), the clamping circuit 9 of the AND gate 4 needs to thoroughly clamp the signal amplified by the second amplifier 3. As a result, the transistor becomes larger in size.

SUMMARY OF THE INVENTION

The present invention has been made in view of the above circumstances, and the object of the present invention is to provide a laser diode drive circuit, an electronic circuit, a method for controlling a laser diode drive circuit, and a duty control method that can realize stable shutdown of outputs from a semiconductor laser and stable output duty control.

According to an aspect of the present invention, there is provided a laser diode drive circuit including: a duty control amplifier that controls a duty ratio of a main signal for laser control in accordance with a duty control signal; and a logic circuit that outputs the duty control signal to the duty control amplifier, and outputs a duty control signal that controls the duty ratio of the main signal to be 0% in the duty control amplifier in accordance with a shutdown signal of a laser diode. With this structure, there is no need to input the main signal having the duty ratio controlled to a logic circuit that becomes unstable. Thus, outputs from a semiconductor laser can be shut down, and the output duty can be controlled in a stable manner.

The laser diode drive circuit may further include an amplifier that amplifies the main signal in a stage before the duty control amplifier. Since the duty of the main signal is controlled after the amplitude of the main signal is adjusted, the duty ratio control can be performed on the main signal, while being unaffected by the amplitude of the main signal.

The laser diode drive circuit may further include an amplifier that amplifies the main signal in a stage after the duty control amplifier. Accordingly, a main signal with desired amplitude can be obtained.

The laser diode drive circuit may be configured so that the duty control amplifier superimposes the duty control signal to the main signal, to adjust the duty ratio of the main signal.

According to another aspect of the present invention, there is provided an electronic circuit including: a duty control amplifier that controls a duty ratio of a main signal in accordance with a duty control signal; and a logic circuit that outputs the duty control signal to the duty control amplifier, and outputs a duty control signal that controls the duty ratio of the main signal to be 0% in the duty control amplifier in accordance with a shutdown signal.

According to yet another aspect of the present invention, there is provided a method for controlling a laser diode drive circuit, including the step of inputting a duty control signal that controls a duty ratio of a main signal to be 0%, to a duty control amplifier that controls the duty ratio of the main signal for laser control, in accordance with a shutdown signal of a laser diode.

According to a further aspect of the present invention, there is provided a duty control method comprising the step of inputting a duty control signal that controls a duty ratio of a main signal to be 0% to a duty control amplifier in accordance with a shutdown signal, the main signal being input to the duty control amplifier.

BRIEF DESCRIPTION OF THE DRAWINGS

FIG. 4 is a block diagram showing the structure of a LD drive circuit according to an aspect of the present invention;

DESCRIPTION OF THE PREFERRED EMBODIMENTS

Figure 1:
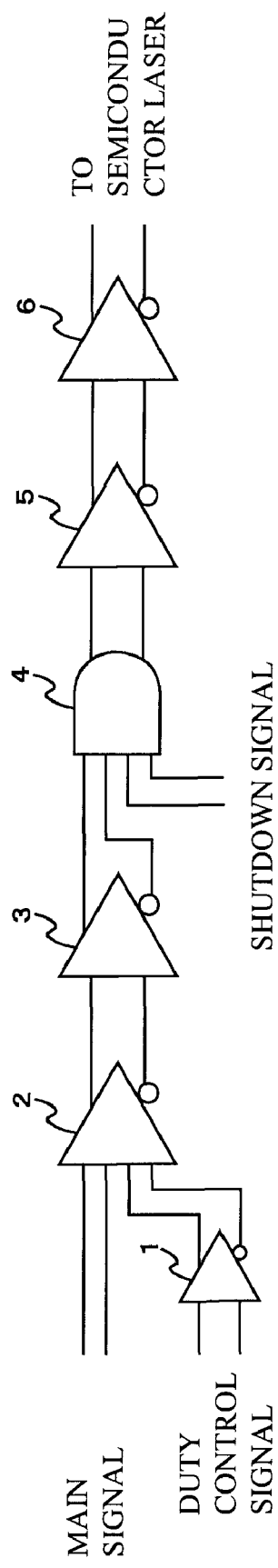
FIG. 1 is a block diagram showing the structure of a conventional LD drive circuit.
Figure 2:
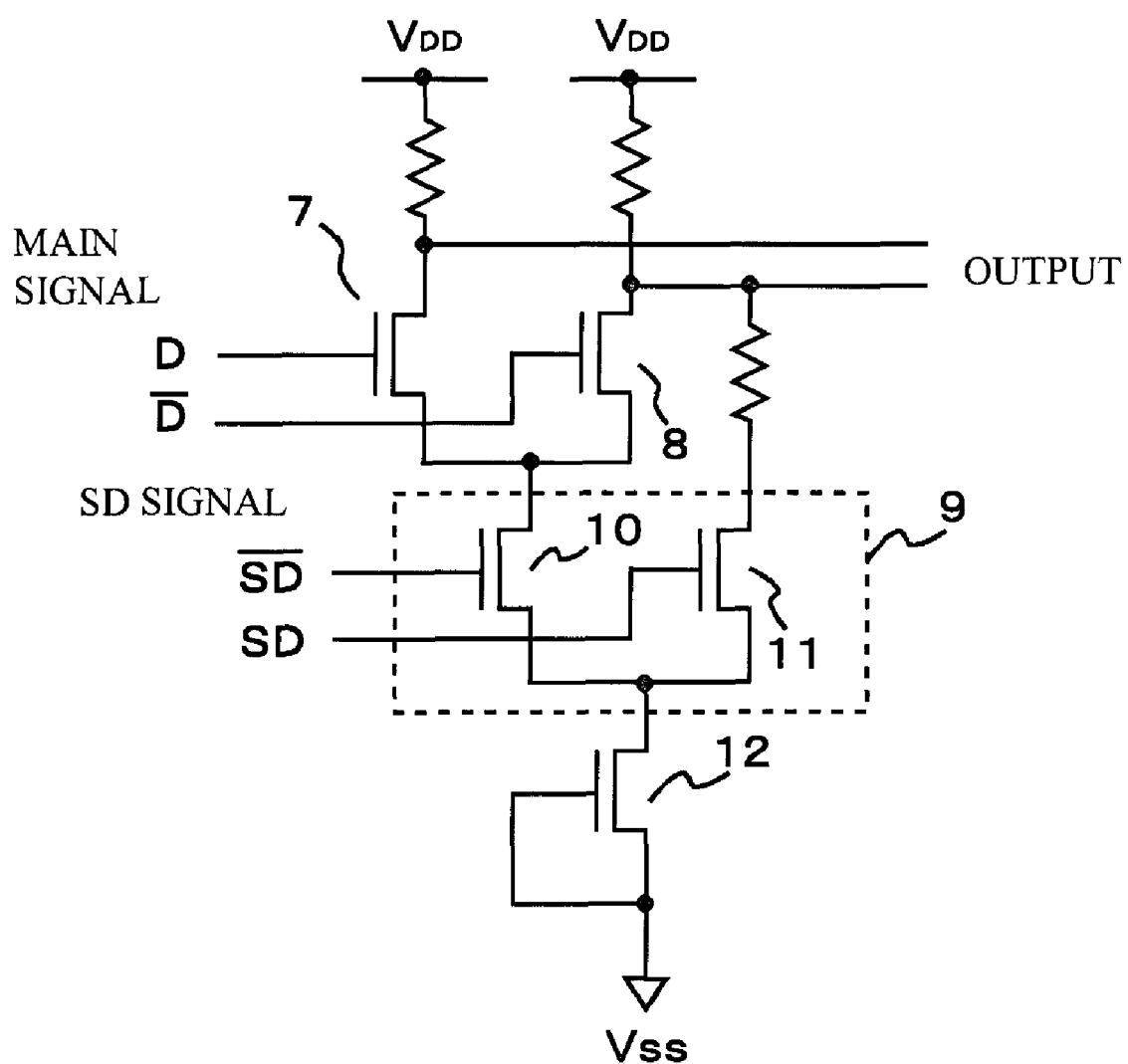
FIG. 2 illustrates the structure of the AND gate.

The following is a description of preferred embodiments of the present invention, with reference to the accompanying drawings.

FIG. 4 illustrates the structure of a LD drive circuit of the present invention. The LD drive circuit 20 of this embodiment includes: a first amplifier 21 that amplifies a main signal for controlling the switching on and off of a semiconductor laser; an AND gate 22 that receives a duty control signal and a shutdown signal (SD signal) from outside, and performs an AND operation; a duty control amplifier 23 that receives output signals from the first amplifier 21 and the AND gate 22, and performs duty control; and a second amplifier 24 and a third amplifier 25 that are provided for amplification. The LD drive circuit 20 shown in FIG. 4 is placed on an IC chip, and operates upon receipt of a duty control signal and a shutdown signal from outside.

The first amplifier 21 amplifies a main signal in the stage before the duty control amplifier 23 for duty control. By amplifying the main signal before duty control, it is possible to control the duty while being unaffected by the amplitude of the main signal.

The AND gate 22 receives a shutdown signal for shutting down the output from the semiconductor laser. The AND gate 22 then performs a logic operation so that a duty control signal for controlling the output of the semiconductor laser is not output to the circuits in the later stages. In this embodiment, the shutdown signal is a digital signal.

Figure 3A:
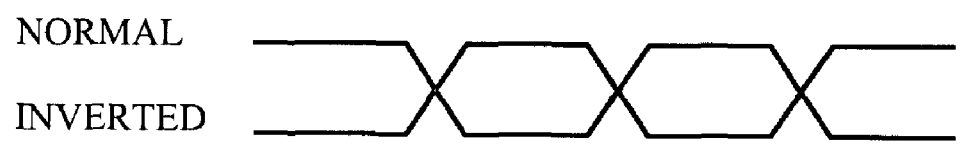
FIG. 3A shows the waveforms of a main signal before the duty ratio is adjusted.
Figure 3B:
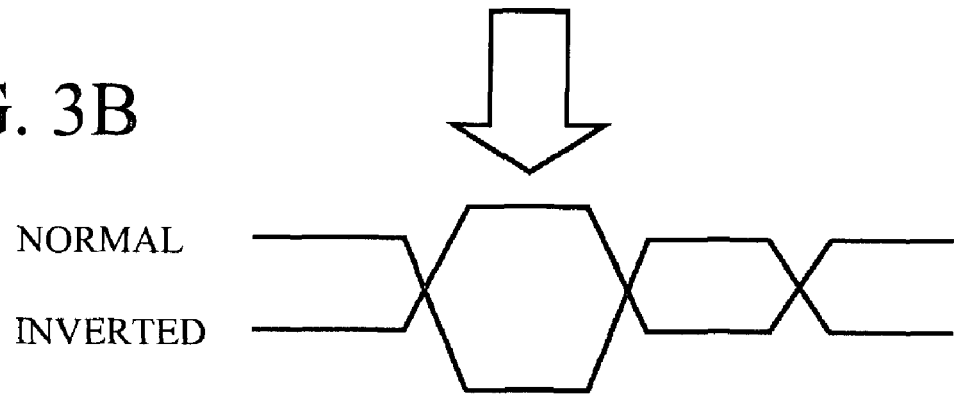
FIG. 3B shows the waveforms of a main signal after the duty ratio is adjusted.

The duty control amplifier 23 receives the main signal amplified by the first amplifier 21. The duty control amplifier 23 also receives the duty control signal output from the AND gate 22, if a shutdown signal is not input to the AND gate 22. The duty control amplifier 23 determines the duty ratio of the main signal by superimposing the duty control signal with the input main signal. The signal that is output from the duty control amplifier 23 has a difference in voltage level between the normal side and the inverted side, as shown in FIG. 3B. In this embodiment, it is not necessary to provide a logic operation circuit that becomes unstable after the duty of the main signal is controlled, as shown in FIG. 4. Accordingly, the shutdown of outputs from the semiconductor laser and the output duty control can be realized in a stable manner. Here, the duty control signal is an analog signal.

The second amplifier 24 and the third amplifier 25 amplify the level of the signal after the duty control.

Figure 5:
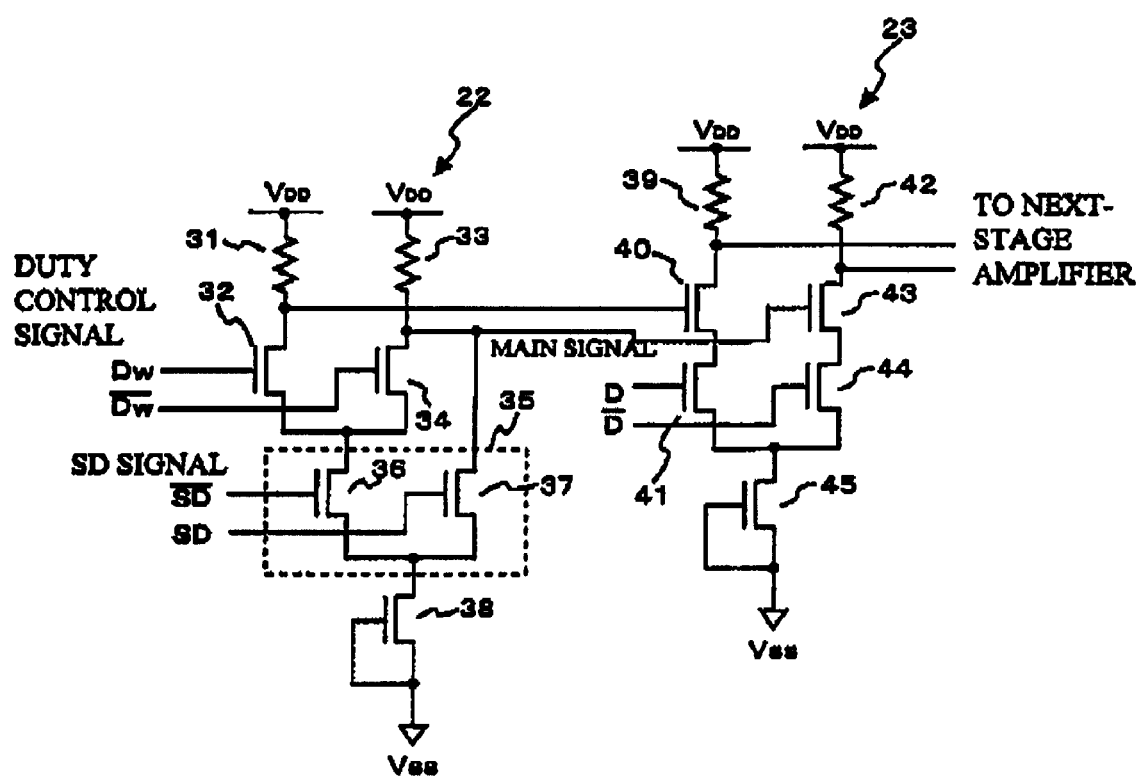
FIG. 5 shows the structures of the AND gate and the duty control amplifier according to an aspect of the present invention.

FIG. 5 illustrates the structures of the AND gate 22 and the duty control amplifier 23.

The AND gate 22 includes: a differential FET pair 32 and 34 that capture the duty control signal; a differential FET pair 36 and 37 for data clamping; and a FET 38 that is placed below the shared source of the differential FET pair 36 and 37, and functions as a current source.

Likewise, the duty control amplifier 23 includes a differential FET pair 40 and 43 that capture the duty control signal output from the AND gate 22; a differential FET pair 41 and 44 that capture the main signal; and a FET 45 that is placed below the shared source of the differential FET pair 41 and 44, and functions as a current source.

If the shutdown signal SD is at the low level (hereinafter referred to as the L-level) while the inverted signal of the shutdown signal SD is at the high level (hereinafter referred to as the H-level), the FET 36 becomes conductive, and the FET 37 becomes non-conductive in the AND gate 22. Accordingly, the logic of the duty control signal input to the FETs 32 and 34 is output to the duty control amplifier 23 as it is. In other words, when the duty control signal Dw is at the H-level while the inverted signal of the duty control signal Dw is at the L-level, the FET 32 becomes conductive, and the FET 34 becomes non-conductive. Accordingly, the duty control signal Dw at the L-level is supplied to the FET 40 of the duty control amplifier 23, and the inverted signal at the H-level is supplied to the FET 43. If the duty control signal Dw is at the L-level while the inverted signal of the duty control signal Dw is at the H-level, the duty control signal Dw at the H-level is supplied to the FET 40 of the duty control amplifier 23, and the inverted signal at the L-level is supplied to the FET 43.

The duty control amplifier 23 superimposes the duty control signal shared between the gates of the differential FET pair 40 and 43 to the main signal supplied to the gates of the differential pair 41 and 44. The duty control amplifier 23 then outputs the superimposed signal to the second amplifier 24 in the later stage.

If the shutdown signal SD is at the H-level while the inverted signal of this signal is at the L-level, the FET 36 becomes non-conductive, and the FET 37 becomes conductive. Accordingly, the path of the current flowing through the differential FET pair 32 and 34 is closed, and the duty control signal input from outside is not output to the duty control amplifier in the next stage. A H-level signal is input to the FET 42, and a L-level signal is input to the FET 43. The signal that controls the duty ratio of the main signal to be 0% is input to the duty control amplifier 23, and is superimposed to the main signal. As a result, outputs from the semiconductor laser are shut down.

As described above, in this embodiment, the AND gate 22 controls whether to output the duty control signal to the duty control amplifier 23 in accordance with the shutdown signal. Accordingly, there is no need to provide a logic operation circuit that becomes unstable, after the duty of the main signal is controlled. Thus, the shutdown of outputs from the semiconductor laser and the output duty control can be realized in a stable manner. Further, there is no need to clamp the signal amplified by the amplifiers, and there is no need to form a large-size transistor. Since it is not necessary to provide a logic operation circuit that becomes unstable after the duty of the main signal is controlled, a buffer amplifier for signal level adjustment is also unnecessary.

Furthermore, since the duty ratio of the main signal is controlled after the amplitude of the main signal is adjusted by the first amplifier 21, the duty control is unaffected by the amplitude of the main signal.

Figure 6:
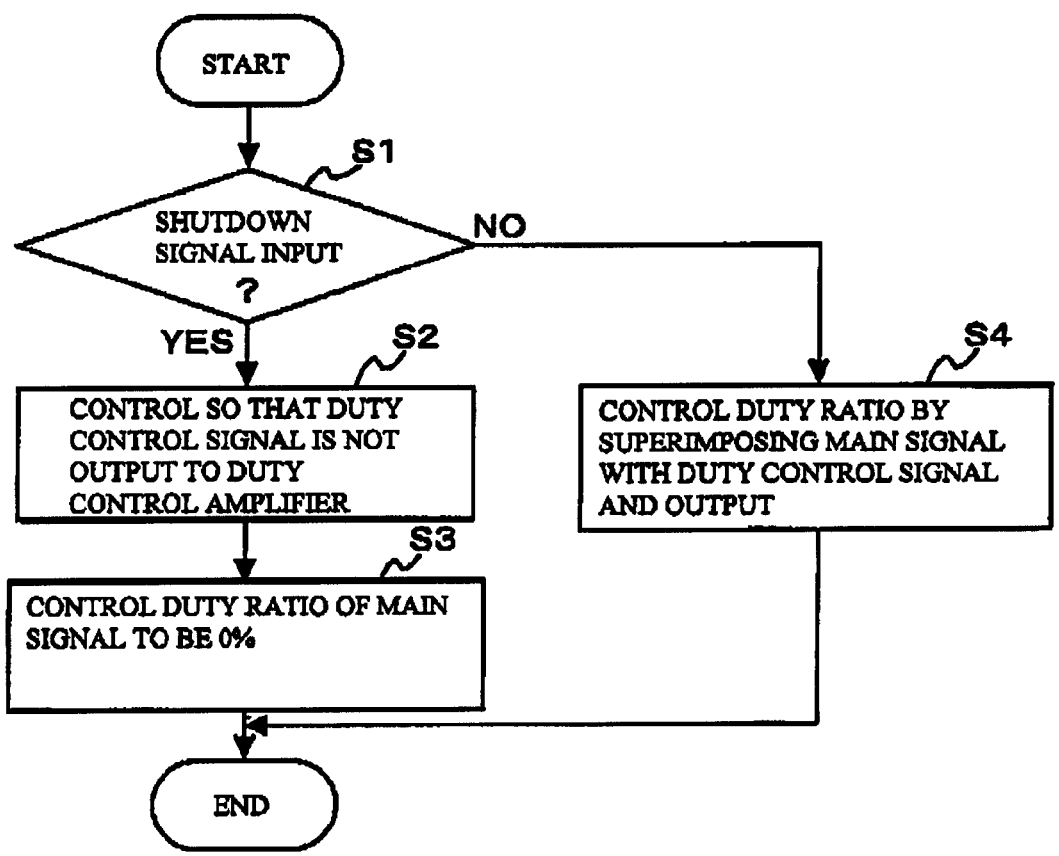
FIG. 6 is a flowchart showing the procedures for operating the LD drive circuit according to an aspect of the present invention.

Referring now to the flowchart of FIG. 6, the structure of this embodiment is described.

When a shutdown signal is input to the LD drive circuit 20 from outside ("YES" in step S1), the AND gate 22 performs a control operation so that the duty control signal is not output to the duty control amplifier 23 in the later stage, and outputs a signal that controls the duty ratio of the main signal to be 0% (step S2). The main signal amplified by the first amplifier 21 is input to the duty control amplifier 23. The duty control amplifier 23 converts the duty ratio of the main signal to 0%, and outputs the main signal to the second amplifier 24 of the later stage (step S3). If the shutdown signal is not input ("NO" in step S1), the duty control amplifier 23 superimposes the duty control signal to the main signal to control the duty ratio, and outputs the superimposed signal to the second amplifier 24 of the later stage (step S4).

The above described embodiment is a preferred embodiment of the present invention. However, the present invention is not limited to the above embodiment, and various changes and modifications may be made to it without departing from the scope of the invention. For example, although the duty control amplifier serves as the second-stage amplifier of the LD drive circuit in the above embodiment, the third-stage amplifier may have the duty control function. It is preferable that the amplifier having the duty control function is placed in an earlier stage in the LD drive circuit. This is because the voltage to be applied to the gate of a FET is higher in a later stage, and, with the high voltage being applied, the gate width becomes larger to increase the chip size.

In the above embodiment, the present invention is applied to a laser diode drive circuit that controls light emission from a laser diode. However, the present invention may be applied to an electronic circuit that can perform switching-on and switching-off operations by controlling the duty of a main signal.

What is claimed is:

1. A laser diode drive circuit comprising:
   a duty control amplifier that controls a duty ratio of a main signal for laser control in accordance with a duty control signal;
   a logic circuit which includes an input of the duty control signal and a shutdown signal, but does not include an input of said main signal;
   said logic circuit outputs the duty control signal to the duty control amplifier, and outputs the duty control signal that controls the duty ratio of the main signal to be 0% in the duty control amplifier in accordance with the shutdown signal being activated, of a laser diode;
   wherein the duty control signal is an analog signal,
   wherein an output of said logic circuit is a first input of said duty control amplifier,
   wherein said main signal is a second input of said duty control amplifier, and
   wherein said logic circuit is an AND gate.

2. The laser diode drive circuit as claimed in claim 1, further comprising
   an amplifier that amplifies the main signal in a stage before the duty control amplifier.

3. The laser diode drive circuit as claimed in claim 1, further comprising
   an amplifier that amplifies the main signal in a stage after the duty control amplifier.

4. The laser diode drive circuit as claimed in claim 1, wherein the duty control amplifier superimposes the main signal to the duty control signal, to adjust the duty ratio of the main signal.

5. An electronic circuit comprising:
   a duty control amplifier that controls a duty ratio of a main signal in accordance with a duty control signal;
   a logic circuit which includes an input of the duty control signal and a shutdown signal, but does not include an input of said main signal;
   said logic circuit outputs the duty control signal to the duty control amplifier, and outputs the duty control signal that controls the duty ratio of the main signal to be 0% in the duty control amplifier in accordance with the shutdown signal being activated; and
   wherein the duty control signal is an analog signal,
   wherein said logic circuit is an AND gate.

6. A method for controlling a laser diode drive circuit, comprising the step of inputting a duty control signal that controls a duty ratio of a main signal to be 0%, to a duty control amplifier that controls the duty ratio of the main signal for laser control, in accordance with a shutdown signal of a laser diode,
   wherein the duty control signal is an analog signal
   wherein a logic circuit includes an input of the duty control signal and the shutdown signal, but does not include an input of said main signal, and
   wherein said logic circuit is an AND gate.

7. A duty control method comprising the step of inputting a duty control signal that controls a duty ratio of a main signal to be 0% to a duty control amplifier in accordance with a shutdown signal, the main signal being input to the duty control amplifier,
   wherein the duty control signal is an analog signal;
   wherein a logic circuit includes an input of the duty control signal and the shutdown signal, but does not include an input of said main signal and
   wherein said logic circuit is an AND gate.

8. A laser diode drive circuit comprising:
   a logic circuit that outputs a duty control signal and a shutdown signal,
   a first amplifier that amplifies a first drive signal,
   a second amplifier which receives the first drive signal, the duty control signal, and the shutdown signal,
   wherein the second amplifier outputs a second drive signal
   wherein said logic circuit includes an input of the duty control signal and the shutdown signal, but does not include an input of said drive signal and
   wherein said logic circuit is an AND gate.

9. A laser diode drive circuit comprising:
   a duty control amplifier that controls a duty ratio of a main signal for laser control in accordance with a duty control signal; and
   a logic circuit that outputs the duty control signal to the duty control amplifier, and outputs the duty control signal that controls the duty ratio of the main signal to be 0% in the duty control amplifier in accordance with a shutdown signal of a laser diode,
   wherein the duty control amplifier superimposes the main signal to the duty control signal, to adjust the duty ratio of the main signal, wherein
   the logic circuit includes an input of the duty control signal and the shutdown signal, but does not include an input of said main signal and
   wherein said logic circuit is an AND gate.

* * * * *